United States Patent [19]

Homma, deceased et al.

[11] 4,187,107
[45] Feb. 5, 1980

[54] MAKING GRAVURE PLATE WITH TINT SCREEN

[75] Inventors: Kokichi Homma, deceased, late of Wako, Japan, by Kenichiro Homma, legal representative; Yoshio Kameyama, Tokyo, Japan

[73] Assignee: Toppan Printing Co., Ltd., Japan

[21] Appl. No.: 936,058

[22] Filed: Aug. 23, 1978

Related U.S. Application Data

[63] Continuation of Ser. No. 700,319, Jun. 28, 1976, abandoned.

[30] Foreign Application Priority Data

Oct. 21, 1975 [JP] Japan .................. 50/126810

[51] Int. Cl.² .............. G03C 5/00; G03F 5/00; G03F 5/20; G03F 5/24
[52] U.S. Cl. .................... 430/252; 430/307
[58] Field of Search .............. 96/36.3, 38, 33, 45; 101/426

[56] References Cited

U.S. PATENT DOCUMENTS

| | | | |
|---|---|---|---|
| 2,987,397 | 6/1961 | Maurer | 96/45 |
| 3,300,308 | 1/1967 | Jemseby | 96/45 |
| 3,325,285 | 6/1967 | Harris et al. | 96/38 |
| 3,597,077 | 8/1971 | Dorn | 96/45 X |
| 3,804,622 | 4/1974 | Bergin | 96/45 X |
| 4,012,257 | 3/1977 | Geris | 96/36.4 |
| 4,059,481 | 11/1977 | Nagano | 96/36.3 X |

OTHER PUBLICATIONS

Burden, "Graphic Reproduction Photography", 4-2-2-74, p. 419.

Primary Examiner—Edward C. Kimlin
Attorney, Agent, or Firm—Lerner, David, Littenberg & Samuel

[57] ABSTRACT

A plate making method for gravure printing which method is easy to carry out and excellent in the tone reproducibility of highlight portion. The method of the invention comprises the steps of: A. exposing a photosensitive material to light source through a gravure screen having desired number of transparent lines; B. exposing the photosensitive material to light through a tint screen and continuous tone positive; C. further exposing the photosensitive material to light through only the continuous tone positive; and D. treating the exposed photosensitive material with succeeding plate making steps such as transferring, developing and etching, in which the order of the above exposing steps A, B and C is not fixed.

14 Claims, 24 Drawing Figures

F I G. 4
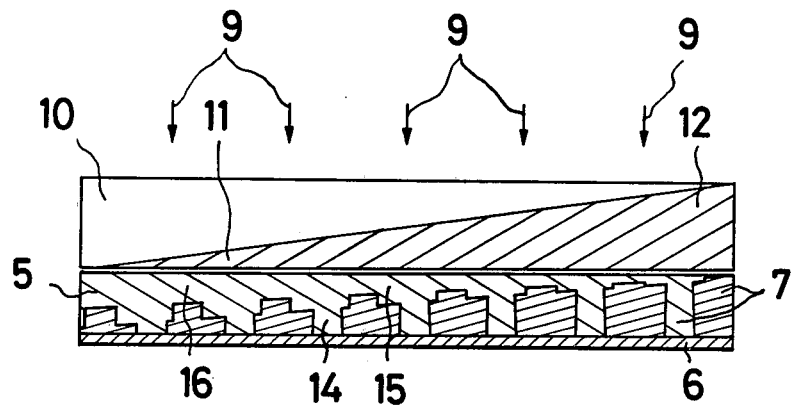
F I G. 5
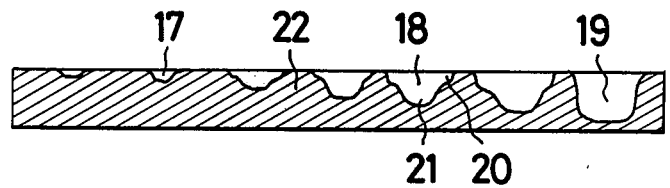
F I G. 6
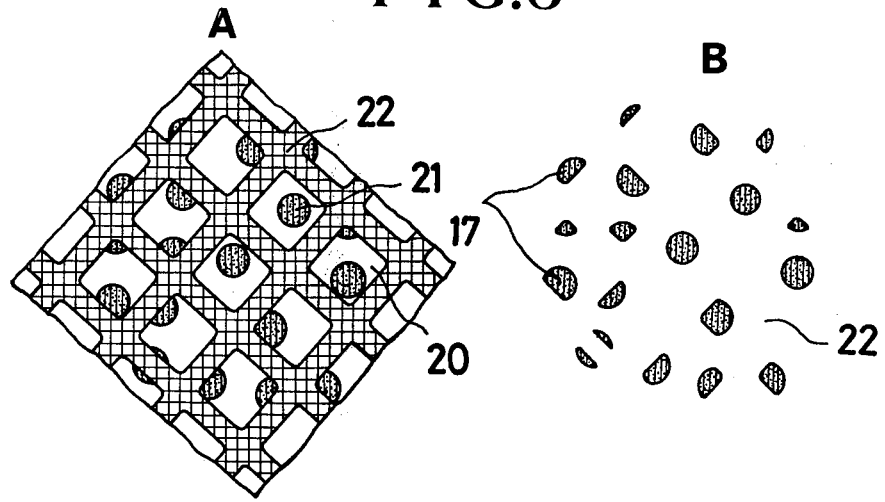

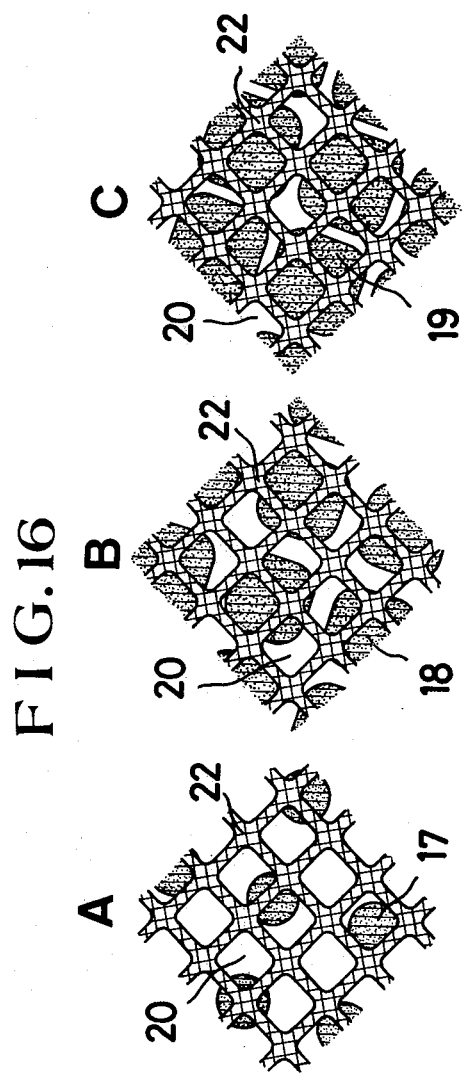
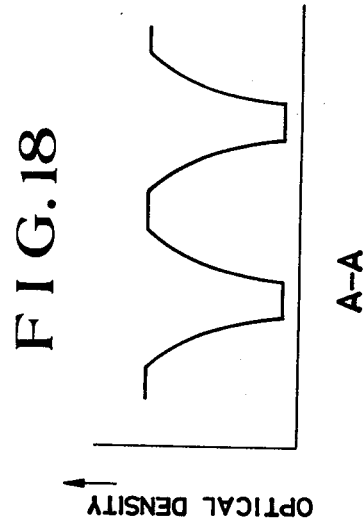
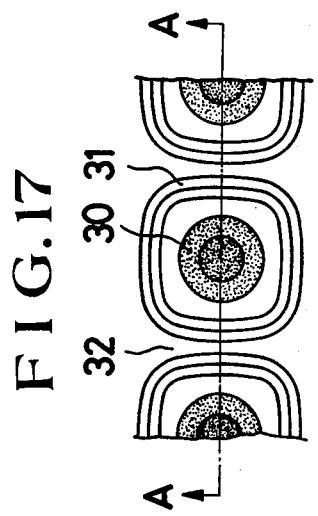
FIG. 16
FIG. 17
FIG. 18

MAKING GRAVURE PLATE WITH TINT SCREEN

This is a continuation of application Ser. No. 700,319, filed June 28, 1976, now abandoned.

BACKGROUND OF THE INVENTION

1. Field of the Invention

This invention relates to a plate making method for gravure printing. More particularly, the invention relates to a plate making method for gravure printing in which a continuous tone positive is used as the original pattern for printing and the invention is characterized in that a tint screen or a special contact screen is used in an exposure step, thereby imparting the factors of both lateral sizes and depths to the ink cells of the gravure printing plate so as to attain excellent tone reproducibility in the gravure printing.

2. Description of Prior Art

The gravure printing methods can be roughly divided into two kinds, one is the conventional gravure printing method in which the gradation is represented with ink cells of varied depths, and the other is the inverted halftone gravure printing method using a halftone positive in which the gradation is represented with ink cells of varied areas.

In the conventional gravure printing method, the resist layer having varied thickness is formed by photomechanically curing the gelatin layer of a carbon resist and the variation of the resist thickness is transferred to a plate material such as a copper plate as the variation of depths of ink cells by means of etching proces. Since the carbon resist is used in this method, various unstable factors can not be avoided in the processes of exposing, developing and etching. Especially, the depths of ink cells of highlight portion is generally about 1 micron, however, it is difficult to attain the accurate formation of such depth without fail. While, in the inverted halftone gravure printing method using a halftone positive, sensitizing solution is applied to a plate material and the plate material is exposed to light through a halftone positive, then the exposed plate material is subjected to development and etching. In this method, a large number of fine halftone dots (ink cells) are formed in the range from highlight portion to light portion. In printing opration, the ink transfer from such small ink cells to the suface of printing material is unstable, thus the halftone dots are liable to be dropped out and the appearance of printed surface becomes rough. Especially, when the printing material is paper, the rough feeling grows worse as the surface of paper is also rough.

Further, in order to remedy the shortcomings of the above-mentioned conventional gravure printing method and inverted halftone gravure printing method, it is considered that the gradation is represented by means of both the sizes and depths of ink cells of printing plate. A typical method is called as double positive method, in which two positives are used, that is, a continuous tone positive is used in order to give the factor of cell depth and a halftone positive, to give the factor of cell area. Each positive is separately printed to a photosensitive carbon resist, however, since two kinds of same sized positives are used, several problems are caused to occur in the process work.

For example, in this method, two positives of a continuous tone positive and a halftone positive are necessary for each color, so that when four color printing is carried out, eight positives are required and they should be correctly registered together. Therefore, the reqistering of positives and the retouching become very troublesome and difficult. Further, in the case tht designation of printing is changed after plate making, the use of photosensitive material increases as well as the increase of trouble for retouching or redoing, and the production cost is increased.

BRIEF SUMMARY OF THE INVENTION

Therefore, in order to eliminate the above disadvantages, the first object of the present invention is to provide a novel method of plate making for gravure printing in which the tone reproducibility, especially in highlight portions, is excellent and stable.

The second object of the present invention is to provide a plate making method for gravure printing in which neither the above-mentioned roughness caused by uneven dots and skipped dots nor moire is caused to occur in highlight portions of printings.

The third object of the present invention is to provide a plate making method for gravure printing in which the plate making process is carried out inexpensively and without difficulty.

In accordance with the present invention, the plate making method comprises:

the first step to expose a photosensitive material to light through a gravure screen having desired number of transparent lines;

the second step to expose the above photosensitive material to light through a tint screen and a continuous tone positive;

the third step to expose again the photosensitive material to light through only the above continuous tone positive; and the fourth step to treat thus exposed photosensitive material with succeeding plate making steps such as transferring, developing and etching.

The above first to third exposure steps can be carried out in any order because the same photosensitive material is only exposed repeatedly. The size and shape of each screen dot of the above tint screen are freely selected. Further, in order to attain a special effect, the tint screen can be partially applied. In some modification of the method of this invention, a special contact screen is used in place of the tint screen. The special contact screen has gradated screen dots.

The photosensitive material used in the method of the present invention are exemplified by carbon resist, resist film and photosensitive resin applied on the surface of a gravure cylinder. According to the kind of such photosensitive material, the above-mentioned succeeding plate making steps may be changed, which will be understood by those skilled in the art.

In order to avoid the formation of moire pattern, a continuous tone negative or a combination of halftone negative and diffusion sheet is used together with the gravure screen in the above-mentined first step. This results in that the transparent lines of the gravure screen are not printed in highlight portions since the optical density of the negative is high in the highlight portions. Further, a continuous tone positive having transparent crosslines can also be used in the method of this invention, and when the transparent crosslines are removed from the highlight portions of the above positive, moire preventing effect can also be expected.

BRIEF DESCRIPTION OF DRAWINGS

In order that the invention may be more fully understood, preferred examples and supplementary features will now be described with reference to the accompanying drawings, in which:

FIG. 4 is an enlarged cross-sectional view of plate making materials in the third step;

FIG. 5 is an enlarged cross-sectional view of a gravure printing plate formed according to the method of the present invention;

FIGS. 6A and 6B are enlarged plan view of a gravure printing plate formed according to the method of the present invention, in which FIG. 6A shows a part of middle tone portion and FIG. 6B shows a part of highlight portion;

FIGS. 10A and 10B are enlarged cross-sectional views of the plate making materials in the second exposure step, in which FIG. 10A shows the portion applied with the partial tint screen and FIG. 10B shows the remainder portion;

FIGS. 16A, 16B and 16C are plan views of the printing plate obtained in the method corresponding to the case shown in FIG. 13, in which FIG. 16A is a highlight portion, FIG. 16B is a middle tone portion and FIG. 16C is a shadow portion;

FIG. 17 is a partially enlarged schematic plan view of the special contact screen used in the case shown in FIG. 13; and FIG. 18 is a graphic representation of the optical density of the screen dots of the special contact screen taken on the line A—A in FIG. 17.

DETAILED DESCRIPTION OF THE INVENTION

Referring now to the accompanying drawings, the present invention be further in detail in order to facilitate the full understanding of the features of the present invention.

Figure 1:
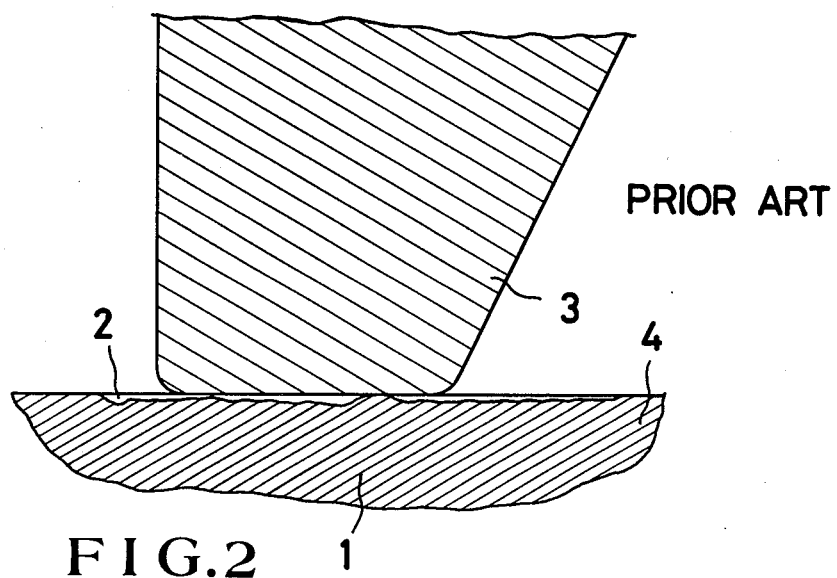
FIG. 1 is a much enlarged cross-sectional view of a part of a gravure printing plate formed by the conventional method and a part of a doctor blade.

In the first place, the state of contact between a gravure printing plate and a doctor blade in the conventional method is illustrated in FIG. 1 in a largely enlarged cross-sectional view. The gravure printing plate 1 has a large number of ink cells 2 that receive printing ink and walls 4 that supports the lowermost edge of the doctor blade 3. The illustrated ink cells 2 are those in a highlight portion of the printing plate 1, so that the depth of ink cell 2 is very small as compared with the horizontal dimensions of the cell and the width of the lower contact edge of the doctor blade 3. Therefore, when the excess ink on the printing plate is removed by the doctor blade 3, the quantity of ink remaining in the cells of highlight portion is liable to become irregular, in addition, when the depth of a cell 2 is a little varied, the variation in the volume of the cell is large. However, these instabilitiesj in the highlight portion are not caused to occur in the portions of middle tone to shadow as the depths of ink cells increase.

On the other hand, ink inverted halftone gravure printing method using a halftone positive, the gradation is represented by the variation of areas of ink cells differing from the conventional gravure printing method, so that the ink cells in the highest portion are deep in relative to the areas of cells. For instance, in the inverted halftone gravure printing method using a halftone positive, the dimensions of ink cells in 5% halftone dot portion are about 30 microns in width and depth when they are formed by using a screen of 175 lines per inch. When the excess ink on the printing plate having such ink cells is scraped off with a doctor blade, the surface of remaining ink in each cell becomes concave and when the fine recesses of paper coincide with such highlight cells, the transfer of ink from the cells to paper can not be done successfully. Further, when the paper is released from the printing plate, some portion of ink is transferred to the paper with a certain ratio according to several conditions and the other portion remains on the printing plate. If the depths of ink cells are too large as compared with the areas of ink cells, the ink held at the bottoms of such ink cells does not participate in the transfer of ink and when the printing conditions are varied, the ratio of ink transfer to paper is caused to change. Thus, the density and gradation of printings become unstable. In order to solve these problems, it is considered that the ink cells are enlarged to the minimum value in which the ink tranfer becomes stable in accordance with the surface smoothness of the material to be printed.

The present invention provides an improved gravure printing method in which the advantages of conventional gravure printing method and inverted gravure printing method using a halftone positive are taken, the reproducibility of gradation in highlight portion is made stable, and the plate making procedure is simple.

Figure 2:
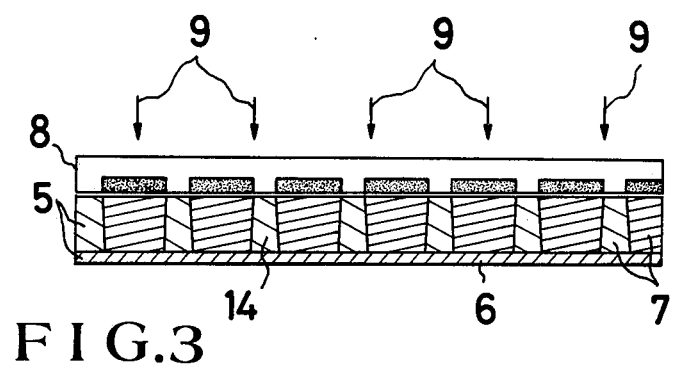
FIG. 2 is an enlarged cross-sectional view of plate making materials in the first step of the method of the present invention.

FIG. 2 shows the first step of the plate making process of the present invention, in which the numeral 5 indicates a sheet of photosensitive carbon resist such as carbon tissue and 6 and 7 indicate baryta paper and gelatin layer, respectively, constituting the component parts of the carbon resist 5. The numeral 8 indicates a gravure screen having transparent lines, 9 indicates the direction of light rays applied in exposure and 14 indicates the cured or hardened portions of the gelatin layer 7. As the carbon resist, the commercially available materials can be used, and in place of the resist, gravure photo-resist such as "Rotofilm" (trademark, made by E. I. du Pont de Nemours & Co. Inc.) can be used. Furthermore, the photosensitive resin such as "Sonne KPM 2000" (tradmark, made by Kansai Paint Co., Ltd.) may also be used by applying it on a gravure cylinder.

As the gravure screen 8, any screens used in the conventional gravure printing method may be employed, and according to the purpose, the screen may be 150, 175, 200, 250 or 300 lines/inch or so. Further, any screens which form the walls for supporting a doctor blade and holding printing ink can be used. Still further, the screen of 1:3 to 1:10 in the ratio of line width may also be used. The configuration of each dot of the gravure screen is generally square, however, it may be a rectangle, tetragon having rounded angles, hexagon, pillow shape, circle or the like, and the transparent line portions generally cross at right angles, however, the angle of intersection may be of any desired value. Furthermore, the boundaries between the transparent lines and non-transparent dots may be distinct or gradated, for example, the optional density in each dot is more than 3.0 and the density is gradually reduced around the edge of dot and becomes transparent in the line portion.

In this first step, the photosensitive carbon resist 5 and the gravure screen 8 are brought into close contact together and the carbon resist 5 is exposed to light through the screen 8, thus the gelatin layer under the transport line portions is cured to form walls of ink cells.

In this first step, if a continuous tone negative having the same dimensions as those of the continuous tone positive, or a negative in which the portions between highlight to middle tone are non-transparent and the other portions between middle tone to shadow are almost transparent, is used by putting it on the above-mentioned gravure screen and the exposure is performed likewise, the pattern of the gravure screen is printed on the carbon resist only in the portion of middle tone to shadow. When such carbon resist is further exposed to light through the undermentioned steps, the gravure printing plate having no pattern of the gravure screen in the portions of highlight to middle tone can be obtained.

Figure 3:
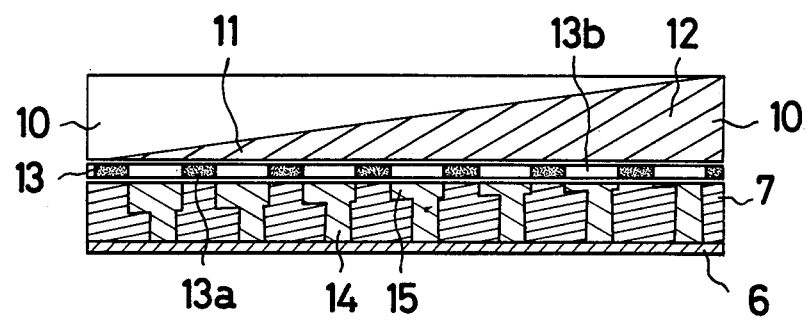
FIG. 3 is an enlarged cross-sectional view of plate making materials in the second step.

In FIG. 3, the plate making materials in the second step of the present invention is shown, in which the numeral 10 denotes a continuous tone positive; 11, a highlight portion; 12, a shadow portion; 13, a tint screen film; 13a, non-transparent portions; 13b, transparent portions; and 15, gelatin portions that are cured by the light exposure in this second step. The object of this step is to add the factor of halftone dots to ink cells in the printing plate so as to form the ink cells having proper areas and depths that are suitable for the stable printing on the material having certain surface smoothness and oil absorptiveness. In this second step, a tint screen 13 and a continuous tone positive 10 are put in layers on the carbon resist 5 from the former first step. With respect to the gravure printing plate, it is desired that printing ink is easily held in ink cells, the ink in the ink cells is well retained there in and after the scraping with a doctor blade and that the ink is stably transferred to the material to be printed even when the surface of material is somewhat rough with fibrous texture. Thus, in order to attain stable printing with a proper ratio of ink transfer, a necessary minimum depth of ink cells is determined, and with this value and the necessary ink volume for each ink cell, the area of each ink cell in highlight portion can be determined. For example, when a tint screen of 175 lines/inch and of 1:3 in line width ratio is used, a depth of 3 to 5 microns or more is necessary for the stable ink transfer, and when the depth of ink cell is smaller than such value, the ink transfer in printing operation becomes not good. When the depth of ink cell in highlight portion is set to 5 microns, the area of ink cell may be made one fourth of the value in the conventional gravure printing method (ink cell depth in highlight portion: 0.5 to 2 microns). That is, when a tint screen of the same ruling number as that of the gravure screen is used, an about 45% tint screen is used in this second step. While, if the area of each screen mesh is too small, the ink transfer to paper can not be done well, so that the area of screen mesh must be made larger than the minimum value. For example, when coated paper is used, the halftone dots of 70 to 80 microns in diameter cause no trouble. If a gravure screen of large ratio in line width is used, a tint screen having 40 micron diameter dots may be practically employed. The desired tint screen can be made by using contact screens for offset or gravure plate making.

Further, the term "tint screen" herein referred to denotes the one having a large number of non-transparent fine screen dots that are generally of the same shape and same area and disposed on the screen surface evenly and regularly. Thus the transparencies of any unit areas of the tint screen containing groups of the fine screen dots are all the same. The shape of each screen dots may be a circle, trigon, tetragon, hexagon, star shape, brick shape, pillow shape or the like. In some case, it may be of irregular shape such as those of grained screen. In general cases, the screen dots are arranged with the same pitch and the same orientation such as 90° disposition, however, they can be irregularly disposed such as those of grained screen. When the tint screen has the screen dots of 90° disposition, the number of line ruling can be represented in like manner as the contact screen for the conventional process work. In order to set the value of unit area of ink cells, the line ruling number may be freely selected, for example, from 100 lines/inch to 600 lines/inch. Generally used tint screen is easily prepared by using silver halide emulsion films, however, other films or sheet coated with several photosensitive material can also be used.

When the above-mentioned carbon resist is exposed to light through the tint screen, the side of photosensitive emulsion of the screen is brought into contact with the gelatin layer of carbon resist, however, if the tint screen is made of a thin film, the side of base sheet may be brought into contact with the gelatin layer.

The second object of this second step is to cause the curing of gelatin layer in the portions under the transparent portions 13b. When the exposure is performed with using the tint screen 13 and the continuous tone positive 10 as shown in FIG. 3, in the highlight portion 11 of continuous tone positive 10, the light rays pass through the positive 10 and through the transparent portions 13b of the tint screen 13, thus the gelatin layer 7 of the carbon resist 5 under such portions is cured, while the gelatin layer under non-transparent portions 13a is not exposed to light and it remains not cured. In the shadow portion 12 of the continuous tone positive 10, the optical density of the positive is so high that light rays hardly pass through the positive. Accordingly, the effect of the tint screen 13 is scarcely given to this portion. In the middle tone portion of the continuous tone positive 10, the passed light to the gelatin layer 7 is in inverse proportion to the optical density of the continuous tone positive 10, and the photo-curing is caused to occur in proportion to the intensity of passed light rays, while the portions of gelatin layer 7 under the opaque portions 13a of the tint screen 13 are not subjected to the photo-curing. Therefore, the portions of gelatin layer 7 under the transparent portions 13b of the screen 13 are photo-cured in proportion to the intensity of light passed through the continuous tone positive 10.

The next third step of the present invention is explained with FIG. 4, in which the numeral 16 indicates the cured portions of gelatin layer 7. The object of this step is to impart the depth factor to ink cells with using the continuous tone positive 10. When the carbon resist 5 obtained in the former step is exposed to light through the continuous tone positive 10 placed in layers on the carbon resist 5, the highlight portions formerly positioned under the non-transparent portions of the tint screen 13 in the second step are exposed to light and the gelatin layer in such portions is cured.

In the shadow portions, only the latent image of walls are formed by the use of the gravure screen having transparent lines in the first step, and also in this third step, since the optical density in the shadow portion 12 of continuous tone positive 10 is high, the degree of photo-curing of gelatin layer 7 is very low. In the middle tone portions, the gelatin layer 7 under the transparent portions 13b of the tint screen 13 has been partly cured in inverse proportion to the optical density of the continuous tone positive 10 in the former second step, thus in this third step, the gelatin layer 7 in such portions is subjected to further photo-curing also in inverse proportion to the optical density of the continuous tone positive 10. The gelatin layer 7 formerly positioned under the non-transparent portions 13a of the tint screen 13 in the second step, is firstly subjected to photo-curing in proportion to the intensity of light passed through the continuous tone positive 10. Therefore, the degree of photo-curing all over the gelatin layer 7 is in inverse proportion to the optical density of the continuous tone positive 10.

The fourth step of the present invention is almost the same as that of the conventional method, that is, this step comprises the steps of: transferring thus obtained exposed carbon resist on the surface of a gravure cylinder; developing the carbon resist and etching the gravure cylinder through the developed carbon resist. However, each ink cell dot contains both the factors of depth and area so that the gelatin relief layer contains thinner portions as compared with that of conventional method. Accordingly, the etching action in the highlight portion occurs relatively early, and the etching time can be reduced, in addition, the undesirable deviation of cell depth in the etching process can be decreased. However, the etching time is made longer in some case in accordance with the dimensions of screen dots of the tint screen, the rates of light exposures in the second and third steps, the concentration of etching solution and so forth.

In the shadow portion of the printing plate, the above-mentioned tint screen is hardly effected but the transparent lines of the gravure screen are printed, therefore, the configuration of the cells in the shadow portion formed by etching is almost the same as that of the conventional method.

In the highlight portion, the cured gelatin layer corresponding to non-transparent dot portion of the tint screen is relatively thick as compared with that in the shadow portion, it does not occur that the etching of highlight portion is finished too early before the shadow portion is sufficiently etched. Further, the depths of ink cells in the highlight portion are increased as the areas of ink cells are decreased. For example, when a tint screen is selected so as to reduce the cell area in the highlight portion to one third, the depth of the cells may be set to thrice value, that is 3 to 5 microns or so. Accordingly, the transfer of printing ink from the cells to paper can be stabilized. In the etching of middle tone portion, the portion corresponding to the non-transparent portion of the tint screen is first etched and the portion corresponding to the transparent portion of tint screen is then etched. Therefore, each ink cell in the middle tone portion has both a shallow portion and a deep portion. The gravure printing plate obtained through the above procedure is shown in FIG. 5 in cross-section. In FIGS. 6A and 6B, the plan views of the printing plate in the middle tone portion and highlight portion are respectively shown. In the drawing, the numeral 17 indicates an ink cell in the highlight portion and 18 indicates an ink cell in the middle tone portion which cell 18 has a shallow portion 20 and a deep portion 21. The numeral 19 indicates an ink cell in the shadow portion, and 22 indicates the wall formed between ink cells 17, 18 and 19.

The present invention comprises the above-disclosed steps, so that when it is compared with the conventional double positive method and the method using photoresist, the plate making method of the present invention is free from the difficulty and complexity of photomechanical process and the increase of production cost. Further, the halftone dots without moire patterns can be formed by making the meshes of tint screen somewhat large even when no adjustment is performed in the intersection angle between the gravure screen and the tint screen. As disclosed above, the depths of ink cells in highlight portion are several times as large as those of the conventional method, so that the partial retouching after the plate making can be carried out easily. That is, the depths of ink cells, especially in highlight portion, are easily increased by applying etching solution or decreased by plating under desired controlled conditions. Therefore, by properly selecting the tint screen, excellent tone reproduction can be attained without any substantial change of the process work.

The main purpose of the present invention is to form halftone dots in highlight portion by using the tint screen having screen meshes smaller than those of the gravure screen, however, the dimension of each screen dot of the tint screen used in the second step may be larger than that of the gravure screen in some cases. The ratio of line width of the gravure screen for general purpose is 1:2 to 1:3 in this case, the area ratio (black portions/total area×100%) of which is about 44 to 56%. In the case that the line ruling number of the gravure screen and that of the tint screen are the same to each other and the cells formed by the gravure screen and the dots of the tint screen are not fitted exactly upon each other, the dots of the tint screen partially extend over the transparent line portions of the gravure screen. Therefore, even when a tint screen having screen dots larger than the ink cells is used, the halftone dots smaller than the ink cells in conventional method are formed. In other words, the purpose of the present invention can be attained by using a tint screen having the same or smaller area ratio than the reciprocal of the area ratio of cells of the gravure screen. If the ratio of line ruling is 1:3 in the gravure screen, the area ratio of cells is 0.56, and its reciprocal 1.8 less value is the area ratio of the tint screen.

Figure 7:
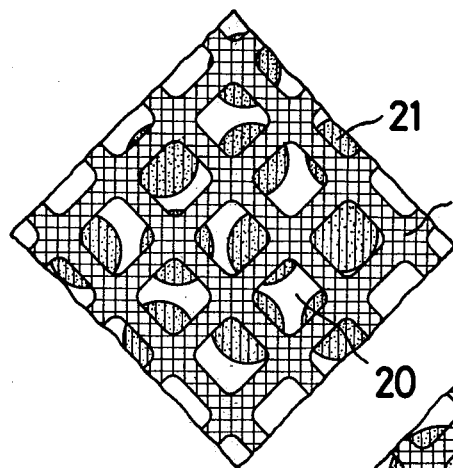
FIG. 7 is an enlarged plan view of another gravure printing plate formed according to the method of the present invention, in which a tint screen having screen dots of the same area as those of the gravure screen is used in the second exposure step.
Figure 8:
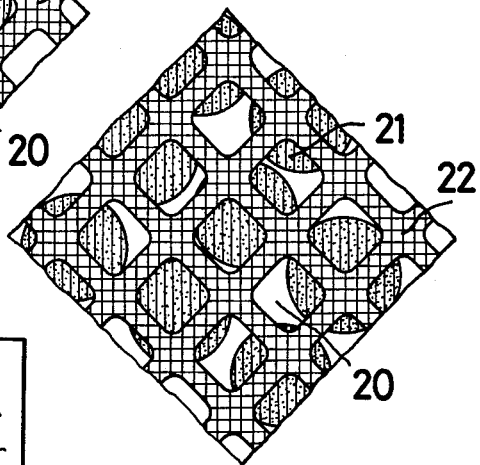
FIG. 8 is an enlarged plan view of a still other printing plate formed according to the method of the present invention, in which the area of each screen dot of the tint screen used in the second step is the same as the sum of the area of each screen dot (cell portion) of the gravure screen and the area of the transparent lines (wall portion) on two sides of the latter dot.

Examples of the above are shown in FIGS. 7 and 8. In FIG. 7, the gravure screen is 175 in number of line ruling and 1:3 in ratio of line width, and the tint screen is 175 in number of line ruling and has the same screen dot percentage as the cell area ratio (56%) of the gravure screen, that is the diameter of each dot of the tint screen is 61 microns. As will be understood from the drawing, when the orientations of the screen dots are properly changed, the area of square cells of gravure screen in a highlight portion is reduced to 0.56-fold.

In FIG. 8, the gravure screen is 175 in number of line ruling and 1:3 in ratio of line width, and the tint screen is 133 in number of line ruling and the area of each dot thereof is 1.8-fold as large as each cell portion of the gravure screen, that is the sum of the area of a single non-transparent cell portion and the area of transparent line portions in two sides of the dot. In the plate making for gravure printing representing patterns with numerous fine ink cells, if every ink cells in highlight portions are to be reduced in their areas, the area of each screen dot of the tint screen is made smaller than the area of each screen dot of the gravure screen. In the case that, in highlight portions, a little portion of ink cells are of the same area as the area of non-transparent dots of the gravure screen and the remaining greater part of ink cells are smaller than the non-transparent dots of the gravure screen, the area of each dot of the tint screen is made the same as or larger than the area of each dot of the gravure screen but smaller than the sum of each screen dot and the transparent lines on two sides of the dot on the gravure screen. When the area of each dot of the tint screen is larger than the sum area of each non-transparent dot and the transparent lines on two sides of the dot of the gravure screen in highlight portions, several percents of the formed ink cells become the same as the dimensions of the non-transparent dots of the gravure screen and the remaining ink cells become somewhat smaller than the dots of the gravure screen.

Figure 9:
FIG. 9 is an explantory drawing for the second step in which the tint screen is partially applied.

Supposng that the drawing shown in FIG. 9 is a continuous tone picture, a gravure printing plate is made through the conventional gravure plate making method by using a carbon resist and a gravure screen. In this process, when only the letters "SEA" 23 are covered by a tint screen and the carbon resist is exposed to light through a continuous tone positive (above second step) and then it is further exposed through the continuous tone positive without the partial covering of the tint screen (above third step), the ink cells in the portion of letters "SEA" 23 become deeper than the other ink cells around such portion. Therefore, the letters "SEA" 23 can be printed with deeper color while the hue and gradation of such portion is the same as the surrounding sky. The pattern of the letters 23 may be cut out of a sheet of tint screen, or exposed through tint screen with a mask covering the parts other than the letter 23. The degree of density in that portion can be controlled by regulating the intensity of exposure of the carbon resist through the partially covering tint screen and continuous tone positive in the second exposure step. Further, it depends upon the area ratio of non-transparent portion of the employed tint screen.

Figure 10:
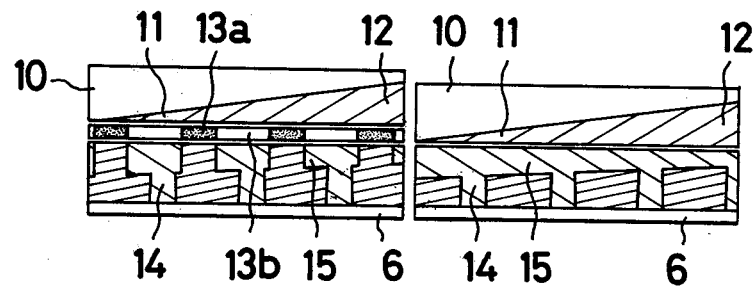
Figure 11:
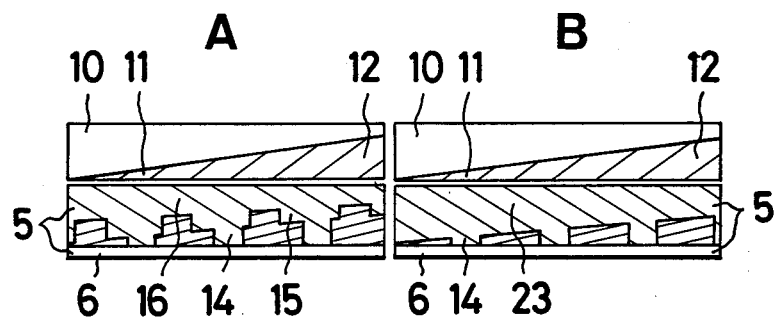
FIGS. 11A and 11B are enlarged cross-sectional views of the plate making materials in the third exposure step, in which FIGS. 11A and 11B correspond to FIGS. 10A and 10B, respectively.
Figure 12:
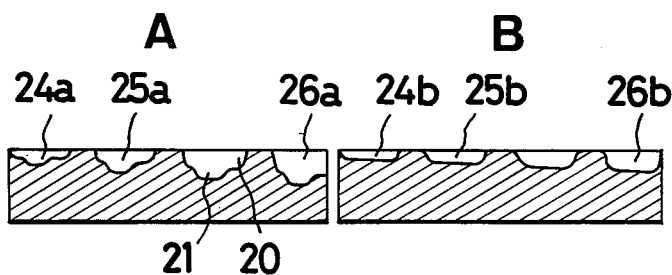
FIGS. 12A and 12B are enlarged cross-sectional views of the obtained printing plates, in which FIGS. 12A and 12B correspond to FIGS. 10A and 10B, respectively.

The above wil be further explained with reference to the accompanying drawings, FIGS. 10, 11 and 12. In the drawings, A is the portion in which the exposure is carried out with both the partially covering tint screen 13 and continuous tone positive 10 in the second step, and B is the portion in which only the continuous tone positive is used. FIG. 10 shows that the portions A and B are subjected to simultaneous exposure, however, the exposure through the tint screen and the exposure through the continuous tone positive may be separately performed. Therefore, in a modification, the volumes of ink cells in the portion of A can be made smaller than those of the portion of B. Further, the tone reproduction curve of the printings can be varied, thus special effect can be imparted to the printed matters. The first step of this method may be the same as the first step shown in FIG. 2. In the second step as shown in FIG. 10, the tint screen may be freely selected according to the aimed effect. In FIG. 10B, it is shown that the carbon resist is cured in inverse proportion to the optical density of the continuous tone positive like the conventional method. FIG. 11 shows the third step, in which the continuous tone positive is again printed to the carbon resist. In order to simplify the process, the portions of A and B are usually exposed to light simultaneously. The numeral 23 indicates the cured portion in portion B which is formed through the exposures of the second and third steps. Thus exposed carbon resist is then subjected to the steps of transferring, developing, drying and etching to form the printing plate as shown in FIG. 12. The portion B is just the same as that obtained through the conventional method. The portion A is a kind of inverted halftone gravure printing plate, each ink cell of which has shallow portion 20 and deep portion 21. In FIGS. 12A and 12B, the numerals 24a and 24b indicate the ink cells in highlight portion; 25a and 25b, those in middle tone portion; and 26a and 26b, those in shadow portion.

Figure 13:
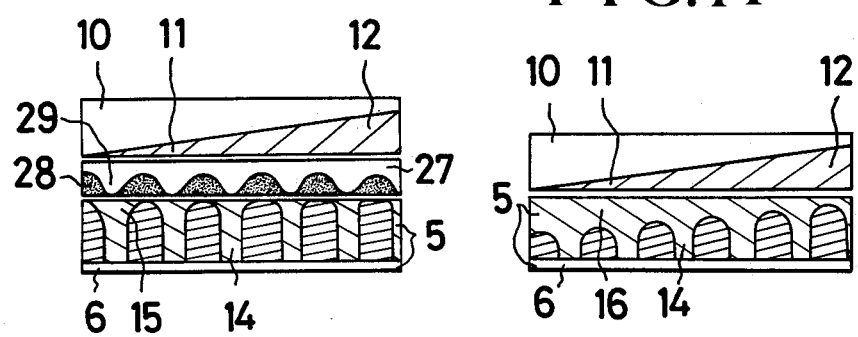
FIG. 13 is an enlarged cross-sectional view of plate making materials in the second step of a modified method of the present invention in which a special contact screen is used.

In the following, another modification of the above-disclosed method will be explained with reference to the accompanying drawings, FIGS. 13 to 18. In this method, a special contact screen 27 is used in place of the foregoing tint screen 13. In the first step of this method, a carbon resist is exposed to light through a gravure screen in like manner as the foregoing method, and in the second step as shown in FIG. 13, a special contact screen 27 and a continuous tone positive 10 are put in layers on the carbon resist 5. The carbon resist 5 is subjected to contact exposure through the special contact screen 27 and the continuous tone positive 10. The special contact screen 27 has also non-transparent screen dots like the above-mentioned tint screen, however, the periphery of each screen dot is shaded off, that is, the center of screen dot is 3.0 or more in optical density and the optical density around the center of each dot is gradually reduced. In the third step of this method, the continuous tone positive 10 is again printed to the carbon resist 5 and the exposed carbon resist is then transferred on the surface of a gravure printing plate material. Through the further developing and etching steps as known in the conventional art, a gravure printing plate of the present invention is formed.

Since the special contact screen having gradated dots is used in the second step, ink cells of several sizes are formed in accordance with the optical density of the continuous tone positive 10. That is, the effect of the special contact screen 27 against the carbon resist 5 is in inverse proportion to the density of the continuous tone positive 10. In the peripheries of screen dots 28 of the special contact screen 27 and is transparent portions 29, the curing of the carbon resist 5 is caused to occur in inverse proportion to the optical density of the continuous tone positive 10 to give the factor of depths of ink cells in like manner as the positive exposure in the conventional method.

Figure 14:
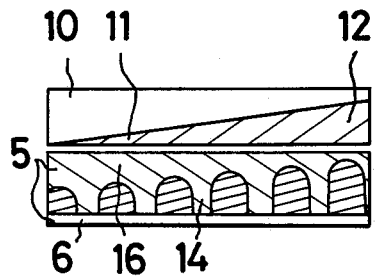
FIG. 14 is an enlarged cross-sectional view of plate making materials in the third step corresponding to the case shown in FIG. 13.

In the third step as shown in FIG. 14, the carbon resist 5 is further exposed to light through the continuous tone positive 10, thus the cured gelatin layer of the resist 5 is thicker in the highlight portion 11 and thinner in the shadow portion 12.

Figure 15:
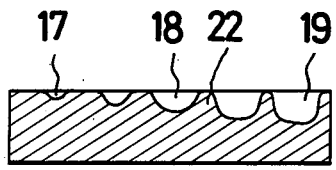
FIG. 15 is an enlarged cross-sectional view of the obtained printing plate in the method corresponding to the case shown in FIG. 13.

Thus obtained carbon resist 5 is further subjected to well known transferring, developing and etching steps so as to form a gravure printing plate, the cross-section of which is shown in FIG. 15. As understood from the figure, the ink cells 17 to 19 are formed between the walls 22.

In FIGS. 16A, B and C, the plan views of thus obtained printing plate are shown, in which FIG. 16A is a highlight portion, FIG. 16B is a middle tone portion and FIG. 16C is a shadow portion.

The special contact screen 27 used in the above method will be further described in detail with reference to FIGS. 17 and 18. FIG. 17 is a partially enlarged plan view of the special contact screen in which the center of dot 30 has an optical density of 3.0 or more and in the peripheral portion 31, the density is gradually reduced. The overall shape of the screen dot may be, for example, square with rounded angles. Around the dots 30 are transparent portion 32 and the area ratio of the portion of 3.0 or more in optical density to the transparent portion 32 is 3 to 4. FIG. 18 is a graphic chart showing the variation of optical density when it is taken on the line A—A in FIG. 17.

It is to be noted that the configuration of each dot, density gradation and the ratio of transparent portions to non-transparent portions may not be restricted to the above example.

Further, in the above examples, the present invention is disclosed on the case in which a carbon resist is used, however, in place of the carbon resist, resist films such as "Rotofilm" (trademark, made by E. I. du Pont de Nemours & Co., Inc.) and the photosensitive resin applied on a gravure cylinder can also be used. If the present invention is fully apprehended, the small modifications necessary for the use of such material may be easily understood by those skilled in the art.

That is, the principle of light exposure steps corresponding to the above-mentioned first to third steps is almost the same as the case in which a carbon resist is used, however, the succeeding plate making steps are somewhat different. When a gravure resist film is used, the exposed film is firstly developed with developing agents then transferred on the surface of gravure cylinder and it is again developed with hot water, further the surface of gravure cylinder is etched through the developed film. When a photosensitive resin layer formed on a gravure cylinder is used, it is directly developed on the gravure cylinder after the exposure and used as the printing plate as it stands.

Furthermore, with the above-disclosed method of the present invention using a tint screen or a special contact screen, a positive film having transparent crosslines for gravure printing plate making can also be formed. That is, in place of the carbon resist used in the above process, a process film is used to form a negative having non-transparent crosslines. More particularly, in the first step, the process film is exposed to light through a gravure screen having transparent lines. Thus obtained film is further exposed to light through a continuous tone positive in the next step. This film is then developed to obtain a negative having non-transparent crosslines. In a further step, the negative is contact-printed to another process film and the latter is developed to obtain a positive having transparent lines which is used for gravure printing plate making.

In the above examples, continuous tone positives are used, however, in place of the continuous tone positive, the combination of a halftone positive and a diffusion sheet (a spacer placed between the carbon resist and the halftone positive) may be used. In the above-mentioned procedure to form a positive film having transparent crosslines, the lines in highlight to middletone portions may not be formed when a continuous tone negative is used together with the gravure screen in the first step.

Still further, when two or more screens are printed on the same sheet of material, moire pattern becomes noticeable especially in the highlight portion. This will be sometimes caused to occur in the method of this invention since a gravure screen and a tint screen or a special contact screen are used. In order to prevent such moire pattern form formation, a continuous tone negative or a combination of a halftone negative and a diffusion sheet (spacer) is used together with the gravure screen in the above-disclosed first step. With the use of the negative, the pattern of the gravure screen is not printed in the highlight portion and the ink cells in the highlight portion are formed only by the tint screen or the special contact screen used in the second step, therefore the formation of moire pattern can be prevented. In addition, the size of ink cells in the highlight portion is made uniform since the screen dots of the tint screen or the special contact screen are not divided by the croslines of gravure screen.

Although the present invention has been described in connection with preferred examples thereof, many variations and modifications will now become apparent to those skilled in the art. It should be noted therefore, that the present invention be limited not by the special disclosure herein but only by the appended claims.

What is claimed is:

1. A plate making method for gravure printing using a continuous tone positive, which method comprises the steps of:
   (a) placing a gravure screen having the desired number of transparent lines on a photosensitive material and exposing to light said photosensitive material through said gravure screen so that the portions of said photosensitive material under the transparent portions of said gravure screen may be cured,
   (b) placing a tint screen having transparent portions and a large number of opaque dots and also placed a continuous tone positive on said photosensitive material and again exposing said photosensitive material to light, the opaque dots of said tint screen being uniform in area, thereby said photosensitive material portions under the transparent portions of said tint screen being curved in response to the darkness of said continuous tone positive so that said curing is shallow in the shadow portions and deep in the highlight portions thereof, (c) placing said continuous tone positive on said photosensitive material and again exposing the latter to light, thereby said entire photosensitive material being cured in response to the darkness of said continuous tone positive so the said curing is shallow in the shadow portions and deep in the highlight portions thereof, the order of said steps (a), (b), and (c) being arbitrary, and (d) treating said photosensitive material subjected to said exposure steps to make a gravure plate.

2. A plate making method for gravure printing as claimed in claim 1, wherein the area of each screen dot of said tint screen is smaller than the area of each screen dot of said gravure screen.

3. A plate making method for gravure printing as claimed in claim 1, wherein the area of each screen dot or said tint screen is smaller than the sum of the area of each screen dot of said gravure screen and the area of the transparent lines on two sides of said dot of said gravure screen.

4. A plate-making method for gravure printing as claimed in claim 1, wherein the area of each screen dot of said tint screen is not smaller than the sum of the area of each screen dot of said gravure screen and the area of the transparent lines on two sides of said dot of said gravure screen.

5. A plate making method for gravure printing as claimed in claim 1, wherein said tint screen used in said exposure step B is applied to a portion of said photosensitive material, which portion corresponds to characters and/or patterns of the original to be printed.

6. A plate making method for gravure printing as claimed in claim 1, wherein said photosensitive material is a carbon resist and said succeeding plate making steps comprises the steps of:

transferring exposed carbon resist on the surface of a gravure cylinder;

developing said carbon resist; and etching the surface of said gravure cylinder through said carbon resist.

7. A plate making method for gravure printing as claimed in claim 1, wherein said photosensitive material is a gravure resist film and said succeeding plate making steps comprises the steps of:

developing exposed gravure resist film with developing agents;

transferring said developed gravure resist film on a gravure cylinder;

again developing said gravure resist film with hot water; and etching said gravure cylinder through said gravure resist film.

8. A plate making method for gravure printing as claimed in claim 1, wherein said photosensitive material is a photosensitive resin layer formed on a gravure cylinder and said succeeding plate making steps comprise the step of developing said photosensitive resin layer on said gravure cylinder.

9. A plate making method for gravure printing as claimed in claim 1, wherein a continuous tone negative or a combination of a halftone negative and a diffusion sheet each having the same sizes as those of said continuous tone positive, is put in layers with said gravure screen in said exposure step A.

10. A plate making method for gravure printing as claimed in claim 1, wherein said exposure step A is omitted and a continuous tone positive having transparent crosslines is used in place of said continuous tone positive in said exposure step B.

11. A plate making method for gravure printing as claimed in claim 10, wherein said continuous tone positive having transparent crosslines has said crosslines only in the regions of middle tone to shadow.

12. A plate making method for gravure printing as in claim 1, wherein the resultant plate has a first group of ink cells in response to the dots of said tint screen in the highlight portions of said continuous tone positive, which ink cells have sufficient depth to retain ink after being subjected to a doctor blade, and said plate having a second group of ink cells in the middle tone to the shadow portions of said continuous tone positive, said second group of ink cells each having a deep portion and a shallow portion, said deep portions being formed in response to the dots of said tint screen, said first and second groups of ink cells having a variety of depths proportional to the darkness of said continuous tone positive.

13. A plate making method for gravure printing as in claim 1, wherein the resultant plate has ink cells including a deep portion and a shallow portion, said deep portions being formed between the transparent lines of said gravure screen.

14. A plate making method for gravure printing as claimed in claim 1, wherein said tint screen includes a plurality of opaque half-tone dots and surrounding transparent portions, said half-tone dots being uniformly distributed over said tint screen, the borderline between each of said half-tone dots and said surrounding transparent portions being distinct.

* * * * *

UNITED STATES PATENT AND TRADEMARK OFFICE
CERTIFICATE OF CORRECTION

PATENT NO. : 4,187,107

DATED : February 5, 1980

INVENTOR(S) : Homma, deceased et al.

It is certified that error appears in the above-identified patent and that said Letters Patent are hereby corrected as shown below:

Column 1, line 32, "proces" should read --process--.

Column 1, line 36, "of" should read --in--.

Column 1, line 46, "opration" should read --operation--.

Column 1, line 47, "suface" should read --surface--.

Column 2, lines 1 and 2, "reqistering" should read --registering--.

Column 2, line 59, "above-mentined" should read --above-mentioned--.

Column 4, line 11, after "further" insert --described--.

Column 4, line 30, "instabilitiesj" should read --instabilities--.

Column 4, line 33, "ink" should read --in the--.

Column 4, line 37, "highest" should read --highlight--.

Column 5, line 15, "tradmark" should read --trademark--.

Column 7, line 7, after the word "positive" insert --10,--.

Column 7, line 7, the word "Accordingly," should read --accordingly--.

UNITED STATES PATENT AND TRADEMARK OFFICE
CERTIFICATE OF CORRECTION

PATENT NO. : 4,187,107

DATED : February 5, 1980

INVENTOR(S) : Homma, deceased et al.

It is certified that error appears in the above-identified patent and that said Letters Patent are hereby corrected as shown below:

Column 9, line 16, "the" should read --and--.

Column 9, line 31, "in" (first occurrence) should read --on--.

Column 11, line 10, "is" should read --in--.

Column 12, line 64, "placed" should read --placing--.

Column 13, line 11, "the" should read --that--.

Signed and Sealed this

First Day of July 1980

[SEAL]

Attest:

SIDNEY A. DIAMOND

*Attesting Officer*  *Commissioner of Patents and Trademarks*